US008737523B2

(12) United States Patent
Barnes

(10) Patent No.: US 8,737,523 B2
(45) Date of Patent: May 27, 2014

(54) APPARATUS AND METHOD FOR PREDICTIVE OVER-DRIVE DETECTION

(75) Inventor: Vincent C. Barnes, El Paso, TX (US)

(73) Assignee: Xilinx, Inc., San Jose, CA (US)

( * ) Notice: Subject to any disclaimer, the term of this patent is extended or adjusted under 35 U.S.C. 154(b) by 979 days.

(21) Appl. No.: 12/477,990

(22) Filed: Jun. 4, 2009

(65) Prior Publication Data
US 2010/0308910 A1    Dec. 9, 2010

(51) Int. Cl.
*H04K 1/02* (2006.01)
(52) U.S. Cl.
USPC .......................................... 375/296; 375/297
(58) Field of Classification Search
USPC .......................................................... 375/297
See application file for complete search history.

(56) References Cited

U.S. PATENT DOCUMENTS

| 5,867,065 | A | 2/1999 | Leyendecker | |
| 6,275,685 | B1 * | 8/2001 | Wessel et al. | 455/126 |
| 6,418,173 | B1 | 7/2002 | Matsuoka et al. | |
| 6,570,444 | B2 * | 5/2003 | Wright | 330/149 |
| 6,587,514 | B1 * | 7/2003 | Wright et al. | 375/296 |
| 6,714,073 | B2 * | 3/2004 | Suto et al. | 330/149 |
| 6,751,447 | B1 * | 6/2004 | Jin et al. | 455/114.3 |
| 6,794,936 | B2 | 9/2004 | Hsu et al. | |
| 6,798,843 | B1 | 9/2004 | Wright et al. | |
| 6,882,217 | B1 | 4/2005 | Mueller | |
| 6,903,604 | B2 * | 6/2005 | Kim | 330/2 |
| 6,928,272 | B2 | 8/2005 | Doi | |
| 6,934,341 | B2 * | 8/2005 | Sahlman | 375/297 |
| 6,998,909 | B1 | 2/2006 | Mauer | |
| 7,012,969 | B2 * | 3/2006 | Ode et al. | 375/296 |
| 7,020,447 | B2 * | 3/2006 | Nagatani et al. | 455/114.3 |
| 7,058,369 | B1 * | 6/2006 | Wright et al. | 455/114.2 |
| 7,085,330 | B1 * | 8/2006 | Shirali | 375/296 |
| 7,113,036 | B2 * | 9/2006 | Moffatt et al. | 330/149 |
| 7,113,037 | B2 * | 9/2006 | Nezami | 330/149 |
| 7,151,405 | B2 | 12/2006 | Nezami | |

(Continued)

FOREIGN PATENT DOCUMENTS

| JP | 2001-284980 A | 10/2001 |
| JP | 2002-026665 A | 1/2002 |

(Continued)

OTHER PUBLICATIONS

U.S. Appl. No. 13/279,209, filed Oct. 21, 2011, Dick.
Altera Corporation, "Digital Predistortion Reference Design," copyright 1995, pp. 1-2, available at URL: http://www.altera.com/support/refdesigns/sys-sol/wireless/ref-dig-predis.html or from Altera Corporation, San Jose, California 95134.

(Continued)

*Primary Examiner* — Santiago Garcia
(74) *Attorney, Agent, or Firm* — Michael T. Wallace; Gerald Chan

(57) ABSTRACT

A method and apparatus for efficient drive level selection for, e.g., power amplifiers utilized within a wireless communication system, which utilizes digital predistortion (DPD) to adaptively and predictively select drive level. The DPD, e.g., increases the power amplifier's efficiency while maintaining spectral mask compliance within the designated frequency band of transmission. The method first determines a peak amplitude of an undistorted waveform that is to be transmitted and then predicts the maximum power that is to be transmitted by the power amplifier after the undistorted signal has been predistorted. An over-drive metric is then calculated based upon the predicted drive level of the power amplifier, which indicates whether or not the cascade of the predistorter and the power amplifier is predicted to operate linearly. The over-drive metric may then be used to ensure optimal power amplifier performance, thereby eliminating the need to use overly conservative power amplifier drive settings.

18 Claims, 5 Drawing Sheets

(56) References Cited

U.S. PATENT DOCUMENTS

| | | | |
|---|---|---|---|
| 7,177,603 B1* | 2/2007 | Wright et al. | 455/90.1 |
| 7,203,247 B2* | 4/2007 | Bauder et al. | 375/296 |
| 7,260,365 B1* | 8/2007 | Wright et al. | 455/91 |
| 7,269,231 B2 | 9/2007 | Ding et al. | |
| 7,333,562 B2* | 2/2008 | Iwasaki | 375/297 |
| 7,336,716 B2* | 2/2008 | Maltsev et al. | 375/260 |
| 7,348,844 B2 | 3/2008 | Jaenecke | |
| 7,514,996 B2 | 4/2009 | Furuta et al. | |
| 7,729,446 B2* | 6/2010 | Copeland | 375/297 |
| 7,737,779 B2 | 6/2010 | Summerfield | |
| 7,741,906 B1 | 6/2010 | Summerfield | |
| 7,746,167 B1 | 6/2010 | Summerfield | |
| 7,944,295 B2* | 5/2011 | Hongo et al. | 330/149 |
| 8,229,025 B1 | 7/2012 | Summerfield | |
| 8,285,770 B1 | 10/2012 | Barnes et al. | |
| 2001/0007435 A1* | 7/2001 | Ode et al. | 330/149 |
| 2002/0064236 A1* | 5/2002 | Matsuoka et al. | 375/296 |
| 2003/0063686 A1 | 4/2003 | Giardina et al. | |
| 2003/0104792 A1* | 6/2003 | Doi | 455/115 |
| 2005/0231279 A1* | 10/2005 | Moffatt et al. | 330/149 |
| 2006/0008028 A1* | 1/2006 | Maltsev et al. | 375/297 |
| 2006/0012426 A1* | 1/2006 | Nezami | 330/149 |
| 2006/0164170 A1* | 7/2006 | Brokaw | 330/300 |
| 2008/0157819 A1 | 7/2008 | Bhandari et al. | |
| 2008/0157869 A1 | 7/2008 | Bhandari et al. | |
| 2008/0157870 A1 | 7/2008 | Bhandari et al. | |
| 2010/0117729 A1 | 5/2010 | Shako et al. | |

FOREIGN PATENT DOCUMENTS

| | | |
|---|---|---|
| JP | 2004-312344 A | 11/2004 |
| JP | 2005-203925 A | 7/2005 |
| WO | WO 2007-046370 A1 | 4/2007 |

OTHER PUBLICATIONS

Altera Corporation, "Digital Predistortion," Copyright 1995, pp. 1-4, available at URL: http://www.altera.com/end-markets/wireless/advanced-dsp/predistortion/wir-digital-predistortion.html or from Altera Corporation, San Jose, California 95134.

Altera Corporation, "Digital Predistortion Reference Design," Application Note AN-314-1.0, Jul. 2003, pp. 1-46, available from Altera Corporation, 101 Innovation Drive, San Jose, California 95134.

Ding, Lei et al., "A Hammerstein Predistortion Linearization Design Based on the Indirect Learning Architecture," *Proc. of the 2002 IEEE International Conference on Acoustics, Speech & Signal Processing*, May 13, 2002, pp. III-2689-III-2692, vol. 3, IEEE, Piscataway, New Jersey, USA.

Gilabert, Pere L. et al., "Multi-Lookup Table FPGA Implementation of an Adaptive Digital Predistorter for Linearizing RF Power Amplifiers With Memory Effects," *IEEE Transactions on Microwave Theory and Techniques*, Feb. 1, 2008, pp. 372-384, vol. 56, No. 2, IEEE, Piscataway, New Jersey, USA.

Kwan, Andrew et al., "Automating the Verification of SDR Baseband Signal Processing Algorithms Developed on DSP/FPGA Platform," *Proc. of the 2006 IEEE Workshop on Signal Processing Systems Design and Implementation*, Oct. 1, 2006, pp. 5-9, IEEE, Piscataway, New Jersey, USA.

Xilinx, Inc., *J.83 Annex A/C Modulator v2.0*, DS597, Jan. 16, 2007, pp. 1-6, Xilinx, Inc., San Jose, CA USA.

Xilinx, Inc., *J.83 Annex A/C Modulator v2.0*, DS296, Jan. 16, 2007, pp. 1-47, Xilinx, Inc., San Jose, CA USA.

Xilinx, Inc., *J.83 Annex B Modulator v2.0*, DS269, Jan. 16, 2007, pp. 1-6, Xilinx, Inc., San Jose, CA USA.

Xilinx, Inc., *J.83 Annex B Modulator v2.0*, DS285, Jan. 16, 2007, pp. 1-56, Xilinx, Inc., San Jose, CA USA.

* cited by examiner

APPARATUS AND METHOD FOR PREDICTIVE OVER-DRIVE DETECTION

FIELD OF THE INVENTION

The present invention generally relates to over-drive detection and prediction, and more particularly, e.g., to dynamic over-drive detection and prediction as utilized within digital predistortion (DPD)-based transmission systems.

BACKGROUND

The advent of the wireless communication era has brought about the evolution of a variety of air interface standards that define a plurality of wireless communication protocols. Such wireless communication protocols support standards as defined by the third generation partnership project (3GPP), which is a collaboration between groups of telecommunications associations that seek to develop a globally applicable, third generation (3G) mobile phone system specification within the scope of the International Mobile Telecommunications 2000 project of the International Telecommunication Union (ITU). A sampling of relevant 3GPP specifications include long-term evolution (LTE), worldwide interoperability for microwave access (WiMAX), wideband code division multiple access (WCDMA) and time-division synchronous code-division multiple access (TD-SCDMA) specifications to name only a few.

3G wireless communication systems employ, among other features, complex modulation formats to transmit voice, data, and multimedia services over limited bandwidth channels. Such wireless communication systems offer high performance with dependable reliability, but depend upon the linearity of the power amplifiers that exist within the final transmitter stages. Stated differently, the wireless communication systems depend upon their power amplifiers to boost the amplitude of signals that exhibit complex modulation formats without excessive distortion and without excessive signal power leakage outside of the designated frequency band of transmission.

Signal power leakage into adjacent transmission channels, also known as adjacent channel leakage (ACL), may create enough distortion in adjacent channels so as to create excessive bit errors within those channels. As a result, maintaining an adequate ACL ratio (ACLR) throughout the dynamic range of the power amplifier is a critical component that is required to maintain the bit error rate (BER) within acceptable limits.

ACLR, however, may be adversely affected by imperfect in-phase/quadrature-phase (I/Q) modulated spectra that exists within the power amplifier's input signal. ACLR may also be adversely affected by out-of-channel carrier noise and/or intermodulation distortion that may be added by the power amplifier itself. In particular, as the power amplifier approaches compression, the power level of the resultant out-of-band spectral components, or intermodulation (IM) products, increases as well. Since the frequencies of the out-of-band spectral components often exist within the frequency band of adjacent channels, ACLR may be adversely affected.

For WCDMA systems, ACLR is defined to be the ratio of the integrated signal power in the adjacent channel to the integrated signal power in the main channel. Accordingly, an increase in the ACLR is indicative of a communication system that may exhibit increased BER with a resultant decrease in system performance. Unfortunately, WCDMA systems utilize communication signals that exhibit relatively high peak-to-average power ratios, or crest factors. As a result, a power amplifier that is operating close to compression, but is nevertheless operating within a relatively linear region, may be driven into compression with a resultant increase in ACLR due to the high crest factors of the signals being amplified.

One technique that may be used to minimize non-linear operation of a power amplifier of a wireless communication system is simply to reduce the drive level of the power amplifier by an amount that is substantially less than the anticipated peak-to-average power ratio. Such a decrease in the signal drive level, however, may compromise the radio link performance, since a decrease in signal drive level often results in a corresponding reduction in signal-to-noise ratio (SNR). Increasing the signal drive level in order to increase SNR, on the other hand, may lead to gain compression of the power amplifier, which increases the IM products generated by the power amplifier, thereby increasing ACLR as discussed above.

Accordingly, selecting the appropriate drive level of a power amplifier within the final transmitter stage of a wireless communication system is critical to minimize ACLR while maximizing SNR. However, selecting the appropriate drive level is a complicated task, since the compression point of the power amplifier may change over time and temperature. In addition, the peak-to-average power ratio of the transmitted waveform may be highly unpredictable, which further complicates the appropriate selection of the power amplifier's drive level.

Efforts continue, therefore, to develop dynamic and predictive techniques that facilitate appropriate selection of the drive level of power amplifiers that are utilized within wireless communication systems.

SUMMARY

To overcome limitations in the prior art, and to overcome other limitations that will become apparent upon reading and understanding the present specification, various embodiments of the present invention disclose a method and apparatus to facilitate dynamic and adaptive selection of the drive level of power amplifiers utilized within wireless communication systems.

In accordance with one embodiment of the invention, a method for predictive over-drive protection comprises determining a peak amplitude of a pre-distorted waveform and determining an amount of predistortion to be added to the pre-distorted waveform by a predistorter. The method further comprises predicting a maximum power amplitude to be received by a power amplifier after the determined amount of predistortion is added to the pre-distorted waveform. The method further comprises predicting a maximum power amplitude to be transmitted by the power amplifier and computing an over-drive metric in response to the predicted maximum power amplitude to be transmitted and the peak amplitude of the pre-distorted waveform. The method further comprises adding the determined amount of predistortion to the pre-distorted waveform in response to an acceptable over-drive metric computation.

In this embodiment, determining an amount of predistortion to be added comprises computing expansion coefficients to be applied by a digital predistorter. Predicting the maximum power amplitude to be received by the power amplifier comprises computing values contained within a plurality of look-up tables based upon the computed expansion coefficients. Predicting the maximum power amplitude to be received by the power amplifier further comprises: retrieving the look-up table values by indexing into each look-up table with the determined peak amplitude of the pre-distorted waveform; multiplying each retrieved value by a frequency rotation term; summing each multiplied value over a number of memory terms contained in the predistorter; and taking an inverse of the summed values.

Moreover, in this embodiment, predicting a maximum power amplitude to be received by a power amplifier further comprises multiplying the inverse by the determined peak amplitude of the pre-distorted waveform. Predicting a maximum power amplitude to be transmitted by the power amplifier comprises: retrieving the look-up table values by indexing into each look-up table with the predicted maximum power amplitude to be received by the power amplifier; multiplying each retrieved value by a frequency rotation term; summing each multiplied value over a number of memory terms contained in the predistorter; and taking an inverse of the summed values. Predicting a maximum power amplitude to be transmitted by the power amplifier further comprises multiplying the inverse by the predicted maximum power amplitude to be received by the power amplifier. Computing the over-drive metric comprises taking a ratio of the predicted maximum power amplitude to be transmitted and the determined peak amplitude of the pre-distorted waveform. An acceptable over-drive metric computation comprises a computation whose result exceeds a minimum threshold value. An unacceptable over-drive metric computation comprises a computation whose result does not exceed the minimum threshold value.

In accordance with another embodiment of the invention, a digital predistorter comprises an over-drive detector to receive an undistorted signal and is adapted to expand the undistorted signal using expansion coefficients to generate a pre-distorted signal. The digital predistorter further comprises an amplifier, coupled to the over-drive detector to transmit the pre-distorted signal received from the over-drive detector. The digital predistorter further comprises an observation block to sense the transmitted signal and to provide the sensed transmitted signal to the over-drive detector. The over-drive detector generates a metric to facilitate dynamic prediction of an over-drive condition of the amplifier.

In this embodiment, the over-drive detector can comprise a first capture buffer to store a first sample set, the first sample set including samples of the pre-distorted signal. The over-drive detector can further comprise a second capture buffer to store a second sample set, the second sample set including samples of the sensed transmitted signal. The over-drive detector can further comprise an alignment block to receive the first and second sample sets and to align the first and second sample sets with respect to amplitude, delay, and phase to produce a third sample set. The over-drive detector can further comprise a least squares estimator to receive first and third sample sets and in response, compute the expansion coefficients. The over-drive detector can further comprise a conversion block to receive the expansion coefficients and to provide look-up table values generated from the expansion coefficients. The over-drive detector can further comprise a predistorter to receive the undistorted signal and the look-up table values and to programmably expand a magnitude of the undistorted signal in response to the dynamically predicted over-drive condition of the amplifier.

In accordance with another embodiment of the invention, an over-drive detector comprises a first capture buffer to store a first sample set, the first sample set including samples of a pre-distorted signal. The over-drive detector further comprises a second capture buffer to store a second sample set, where the second sample set includes samples of a sensed transmitted signal. The over-drive detector further comprises an alignment block to receive the first and second sample sets and to align the first and second sample sets with respect to amplitude, delay, and phase to produce a third sample set. The over-drive detector further comprises a least squares estimator to receive first and third sample sets and in response, compute expansion coefficients. The over-drive detector further comprises a conversion block to receive the expansion coefficients and to provide look-up table values generated from the expansion coefficients. The over-drive detector further comprises a predistorter to receive the undistorted signal and the look-up table values and to programmably expand a magnitude of the undistorted signal in response to a dynamically predicted over-drive condition.

In this embodiment, the predistorter can model non-linearities of an amplifier that generates the transmitted signal. The predistorter can generate an amplitude-to-amplitude characteristic of the amplifier in response to the look-up table values and the sensed transmitted signal, where the amplitude-to-amplitude characteristic is utilized to dynamically predict the over-drive condition.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
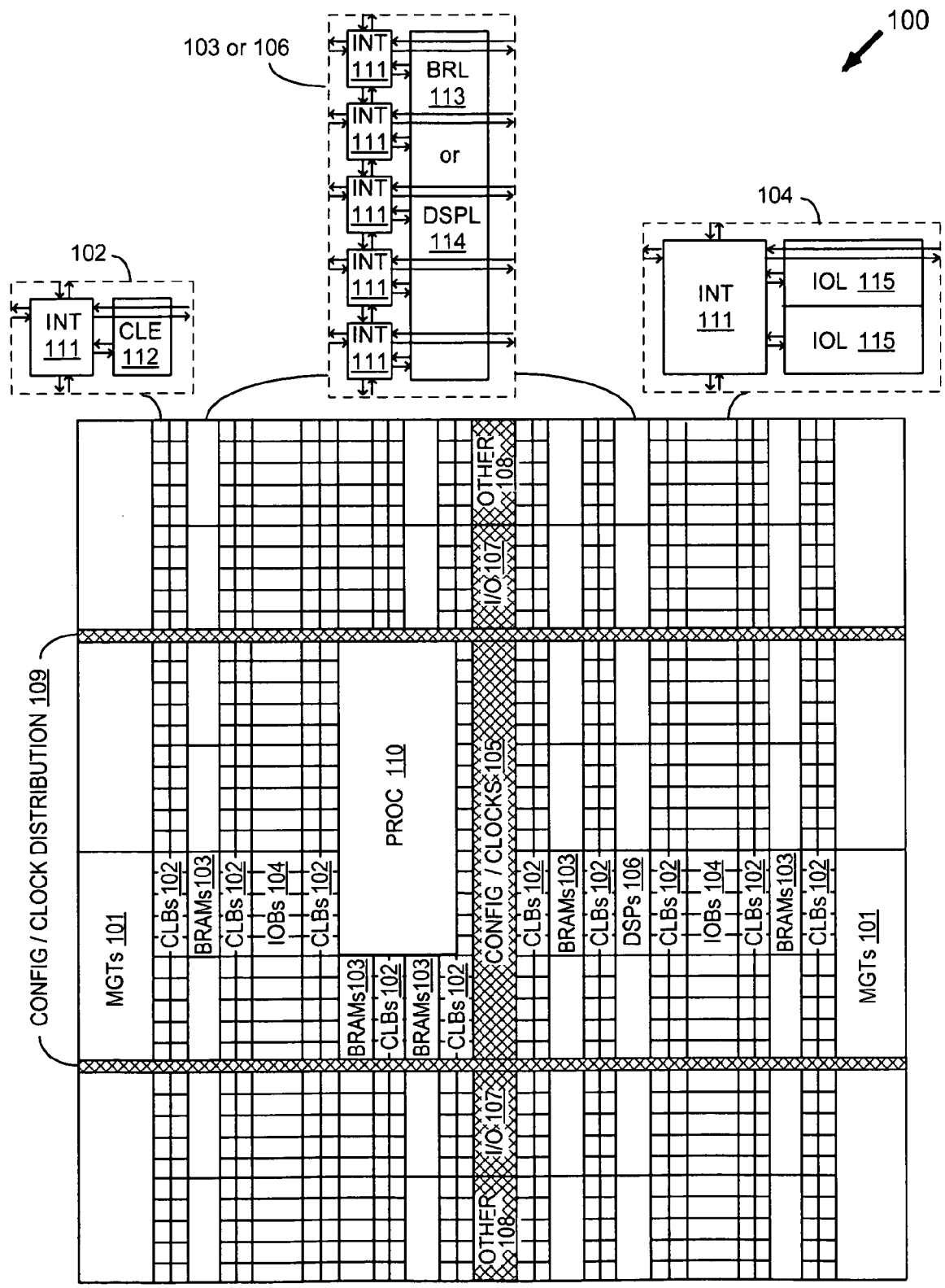
FIG. 1 illustrates an FPGA architecture that includes several different types of programmable logic blocks.

Generally, one or more embodiments of the present invention are applied to the predictive and adaptive selection of appropriate drive levels of power amplifiers utilized within a wireless communication system. In one embodiment, digital predistortion (DPD) is utilized to allow the drive level of the power amplifier to be increased while simultaneously maintaining spectral mask performance. That is to say, in other words, that DPD is utilized to allow the power amplifier to boost the amplitude of signals exhibiting complex modulation formats without excessive distortion and without excessive signal power leakage outside of the designated frequency band of transmission.

Stated differently, the one or more embodiments of the present invention utilize DPD to increase the efficiency of power amplifiers that are utilized within wireless communication systems. Accordingly, DPD is utilized to allow the power amplifiers to increase the amount of output power generated without a commensurate increase in operational power consumed, thereby increasing the efficiency of the power amplifier. DPD also allows such an increase in power amplifier's efficiency while maintaining spectral mask compliance within the designated frequency band of transmission.

As a result, power amplifiers that may be operating without benefit of the DPD in accordance with an embodiment of the present invention are required to exhibit a significantly higher compression point. Thus, DPD in accordance with an embodiment of the present invention facilitates usage of lower-cost amplifiers for a given output power specification, which reduces capital expenditures. DPD in accordance with an embodiment of the present invention also facilitates increased power amplifier efficiency, thereby reducing operational expenditures.

DPD in accordance with an embodiment of the present invention also provides a method to dynamically predict a potential over-drive condition within the power amplifier. The method first determines a peak amplitude of the waveform that is to be transmitted and then predicts the maximum power that is to be transmitted by the power amplifier after the signal has been predistorted. An over-drive metric is then calculated, which indicates whether or not the cascade of the DPD and the power amplifier results in linear operation within the range of the signal dynamics. The over-drive metric may then be used to ensure optimal power amplifier performance, thereby eliminating the need to use overly conservative power amplifier drive settings.

In one embodiment, DPD may be implemented using a programmable logic device (PLD), such as a field programmable gate array (FPGA). In addition, an adaptive predistortion function with parameter estimation may be performed using a processor that is embedded within the FPGA. The executable code and associated data used to implement the adaptive predistortion function may reside within random access memory blocks (BRAMs) which are also embedded within the FPGA.

Turning to FIG. 1, for example, a representative FPGA architecture is illustrated that includes adequate hardware/software facilities to implement DPD in accordance with one or more embodiments of the present invention. FPGA 100 includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs may also include dedicated processor blocks (PROC 110), which as discussed in more detail, may be used to implement software-based functionality as may be required by the DPD of one or more embodiments of the present invention.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
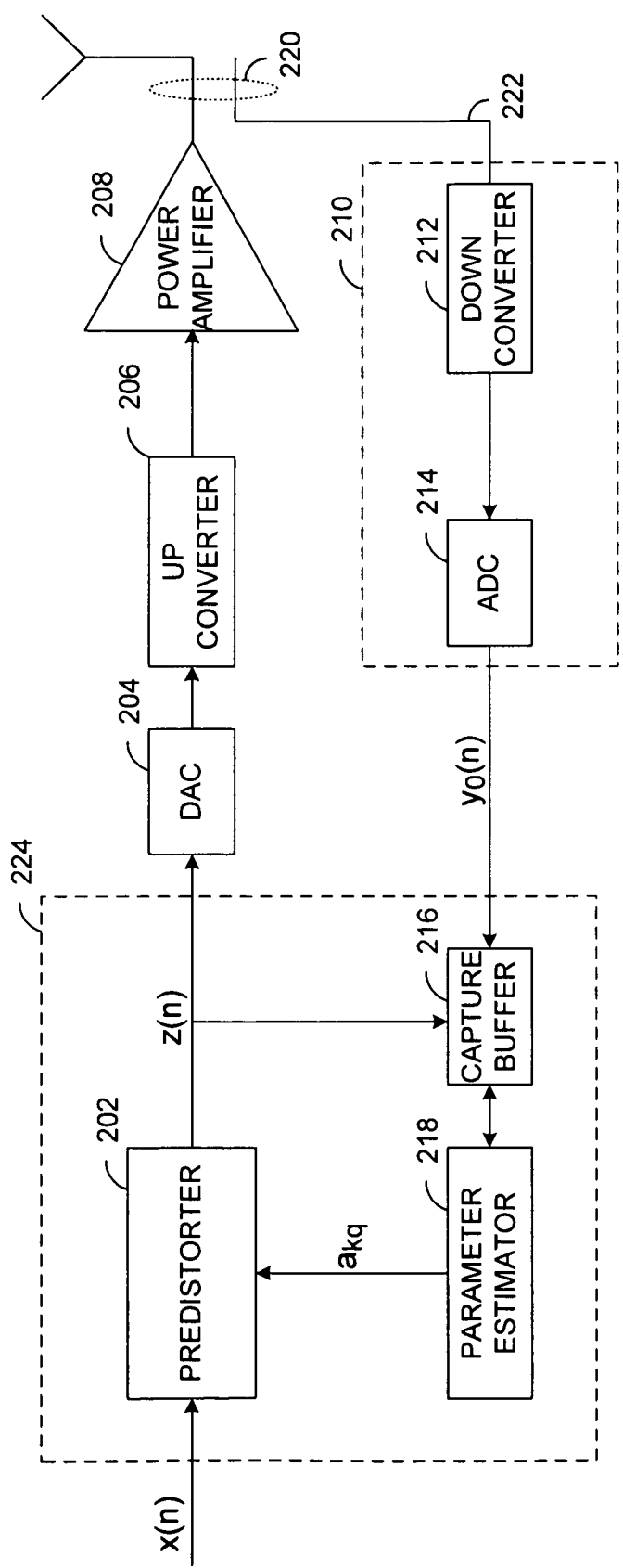
FIG. 2 illustrates a block diagram of a digital predistortion architecture that may be implemented within the FPGA of FIG. 1 in accordance with one embodiment of the present invention.

Turning to FIG. 2, a block diagram of a DPD architecture that may be implemented within FPGA 100 of FIG. 1 in accordance with one embodiment of the present invention is illustrated. In operation, predistorter block 202 operates on data to be transmitted, x(n), in order to preempt the generation of signal distortion within power amplifier (PA) 208 by implementing an inverse model of PA 208. In essence, the non-linearity of PA 208 is modeled by a complex polynomial function of the signal amplitude of signal, x(n), which attempts to match the amplitude-to-amplitude (AM/AM) and/or the amplitude-to-phase (AM/PM) characteristics of PA 208.

Equation (1) illustrates the complex polynomial function that is used to model the non-linear effects of PA 208

$$z(n) = \sum_{k=1}^{K} \sum_{q=0}^{Q-1} a_{kq} y(n-q) |y(n-q)|^{k-1}, \quad (1)$$

where coefficients, $a_{kq}$, are chosen by parameter estimator 218, such that the output of power amplifier 208 closely resembles the predistorted data sequence, x(n). As discussed in more detail below, K is the number of polynomial terms and Q is the number of memory terms implemented within predistorter 202.

In order to separate the linear effects of PA 208 and the circuitry that drives PA 208, e.g., digital-to-analog converter (DAC) 204 and up-converter 206, parameter estimation is based upon an aligned PA output, y(n). The alignment process is performed within parameter estimator 218, which matches the amplitude, delay, and phase variations of $y_0(n)$ with respect to z(n). As a result, predistorter block 202 is configured to model only the non-linear effects of PA 208.

Generation of signal, $y_0(n)$, is performed by observation block 210, which performs, e.g., a heterodyne mixing operation, whereby the output signal from PA 208 is sensed using, e.g., directional coupler 220, to couple a portion of output signal 222 from the output of PA 208 into down converter 212 and analog-to-digital converter (ADC) 214. In one embodiment, the heterodyne mixing operation of observation block 210 down converts signal 222 into a digital baseband signal having, e.g., only a real component, and therefore samples signal 222 at twice the predistortion sampling rate, such that the full bandwidth of signal 222 is digitally represented by signal $y_0(n)$. In such an embodiment, signal $y_0(n)$ is to be decimated by a factor of 2 before further processing is conducted. In alternate embodiments, observation block 210 may instead down convert signal 222 into a lower intermediate frequency (IF) as compared to the RF frequency of signal 222.

Capture buffer 216 is utilized to capture the predistorted data that is to be transmitted, z(n), and to capture the down-converted and sampled observation signal, $y_0(n)$, which is a digital representation of the baseband signal actually transmitted. Parameter estimator 218 is then utilized to adaptively compute the coefficients required to model the inverse of the non-linear effects of PA 208 by utilizing a least squares computation on the data contained within capture buffer 216. In one embodiment, computation of the coefficients is accomplished via processor 110 of FIG. 1. In alternate embodiments, configurable logic within FPGA 100 may instead be utilized to compute the coefficients.

As discussed in more detail below, parameter estimator 218, in combination with capture buffer 216 and predistorter 202, implements over-drive detector 224, which is further utilized to adaptively predict and/or detect an over-drive condition within PA 208. In particular, an alignment process is performed within parameter estimator 218 that matches the amplitude, delay, and phase variations of $y_0(n)$ with respect to z(n). A predictive soft metric is then generated, which indicates when the peaks of the transmitted waveform are entering the saturation region, or gain compression region, of PA 208.

Figure 3:
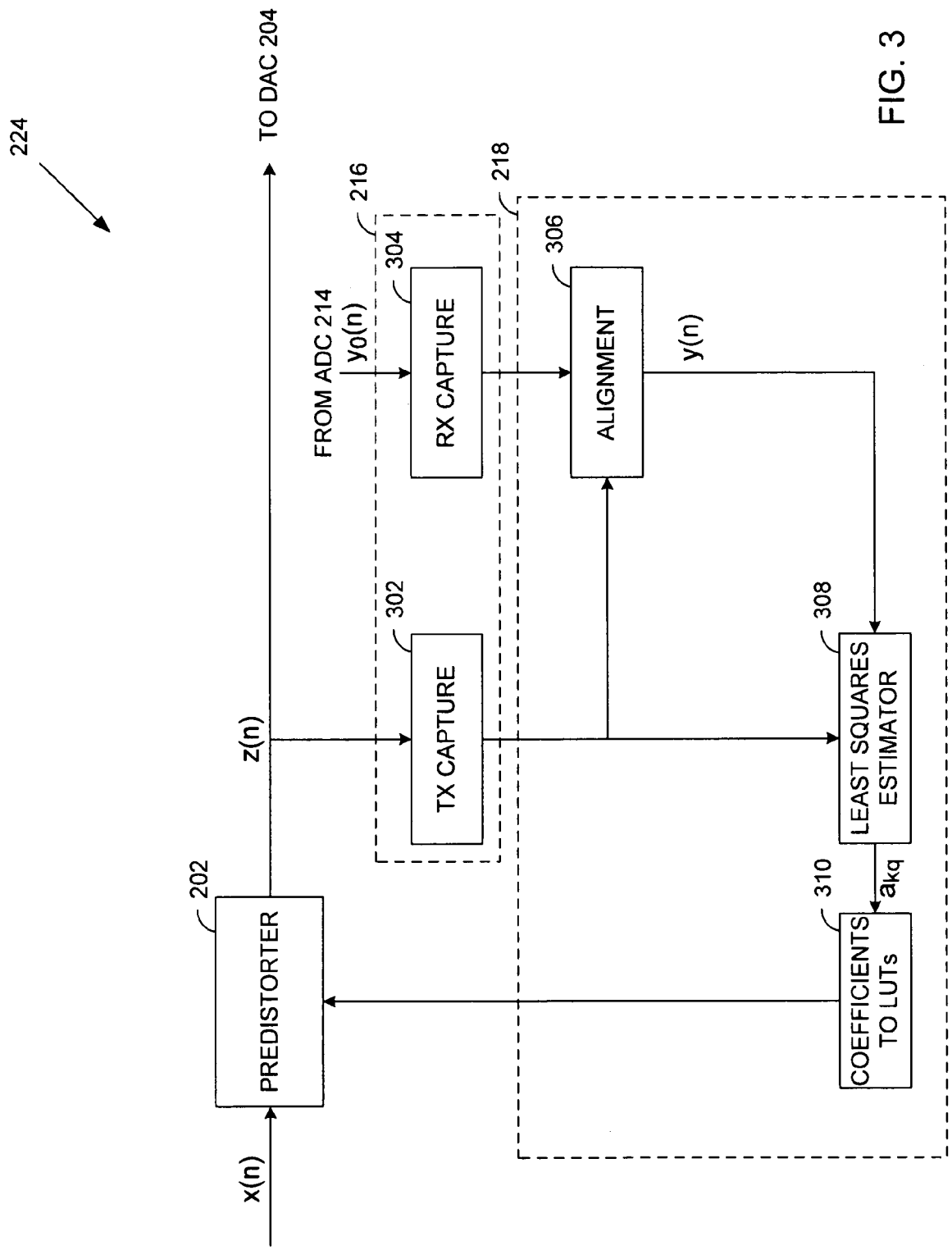
FIG. 3 illustrates an over-drive detection block of the digital predistortion architecture of FIG. 2 in accordance with one embodiment of the present invention.

Turning to FIG. 3, the architecture of over-drive detection block 224 of FIG. 2 is illustrated, which among other features, implements the structure that is implied by equation (1). In one embodiment, the coefficients calculated in least squares estimator 308 are utilized in conversion block 310 to generate look-up table (LUT) values, where each LUT contains, e.g., 256 complex samples of a portion of the polynomials described in equation (1). A total of Q independent LUTs are utilized, for example, whereby each LUT contains the information as described in equation (1 a) as follows:

$$LUT(q) = \sum_{k=1}^{K} a_{kq} |y(n-q)|^{k-1}. \tag{1a}$$

Predistorter 202 then generates each value of z(n) by taking the sum over Q values of the product of each of the complex LUT table values of equation (1 a) and the y(n−q) term at each q index as described in equation (1).

Turning back to equation (1), for example, it can be seen that given the series, y(n) and z(n), the coefficients, $a_{kq}$, may be found by a least squares computation. In one embodiment, the computation is performed within least squares estimator 308 using a discrete characterization event, whereby coefficients, $a_{kq}$, are found that best match the non-linear effects of PA 208 over some time duration over which a block of L samples may be taken. In general, the time duration over which the block of L samples is taken should be considerably shorter than the overall time period over which the spectral measurements are made. In one embodiment, for example, a minimum spectral measurement sweep time of, e.g., 100 ms, may yield a maximum time duration of, e.g., 20 µs, over which a block of L samples may be taken.

In equation (2), a parameter, u, may be defined as follows:

$$u_{kq}(n) = y(n-q)|y(n-q)|^{k-1}, \tag{2}$$

where, U, may be further defined as the L by KQ matrix whose L rows are $u_{kq}(n)$, n=0, 1, 2, ..., L−1, for all k=0, 1, 2, ..., and q=0, 1, 2, .... Combining equation (2) with equation (1), equation (3) can be written in matrix form as:

$$Z = UA, \tag{3}$$

where $A = (a_{10}\ a_{11}\ a_{20}\ \ldots\ a_{KQ-1})$ and $Z = (z(0)\ z(1)\ \ldots\ z(L-1))$. Equation (3) can be solved by pre-multiplying each side by the Hermetian transpose, $U^H$, of U to give $$VA = W, \tag{4}$$

where $V = U^H U$ and $W = U^H Z$, which defines a KQ by KQ linear system whose solution is the best least-squares estimate for the $a_{kq}$ coefficients over the sample length, L.

TX capture block 302 of capture buffer 216 is configured to store the L samples of the predistorted data sequence, z(n), that is to be transmitted by PA 208. RX capture block 304, on the other hand, is configured to store, e.g., 2 L real samples, of the data actually transmitted, $y_0(n)$, from ADC 214 of observation block 210. As a result, alignment block 306 must first decimate the samples received from RX capture block 304 by, e.g., 2, before implementing the alignment function, which as discussed above, aligns transmit data, z(n), with data block, $y_0(n)$, with respect to amplitude, delay, and phase so that only the non-linear effects of PA 208 may be modeled. The resulting aligned data block, y(n), is then provided to least squares estimator 308 by alignment block 306.

Least squares estimator 308 calculates the coefficients, $a_{kq}$, as provided in equation (1), as the best least squares estimate for the solution of equation (4). The coefficients, $a_{kq}$, are then used to calculate the contents of each LUT as discussed above. Predistorter 202 then estimates the inverse of the non-linear effects of PA 208 by taking the sum of each of the complex LUT table values provided by conversion block 310 at each index.

As an example, the U matrix of equation (3) is displayed in Table 1 using, e.g., Q=3 memory terms (y(2), y(1), and y(0)) from RX capture 304, whose Hermetian transpose may by be used to generate coefficients, $a_{kq}$.

TABLE 1

| | | |
|---|---|---|
| $y_2\|y_2\|^0 y_2\|y_2\|^1 y_2\|y_2\|^2 \ldots y_2\|y_2\|^{K-1}$ | $y_1\|y_1\|^1 y_1\|y_1\|^1 y_1\|y_1\|^2 \ldots y_1\|y_1\|^{K-1}$ | $y_0\|y_0\|^1 y_0\|y_0\|^1 y_0\|y_0\|^2 \ldots y_0\|y_0\|^{K-1}$ |
| $y_3\|y_3\|^0 y_3\|y_3\|^1 y_3\|y_3\|^2 \ldots y_3\|y_3\|^{K-1}$ | $y_2\|y_2\|^1 y_2\|y_2\|^1 y_2\|y_2\|^2 \ldots y_2\|y_2\|^{K-1}$ | $y_1\|y_1\|^1 y_1\|y_1\|^1 y_1\|y_1\|^2 \ldots y_1\|y_1\|^{K-1}$ |
| $y_4\|y_4\|^0 y_4\|y_4\|^1 y_4\|y_4\|^2 \ldots y_4\|y_4\|^{K-1}$ | $y_3\|y_3\|^1 y_3\|y_3\|^1 y_3\|y_3\|^2 \ldots y_3\|y_3\|^{K-1}$ | $y_2\|y_2\|^1 y_2\|y_2\|^1 y_2\|y_2\|^2 \ldots y_2\|y_2\|^{K-1}$ |
| $\vdots$ | $\vdots$ | $\vdots$ |

In operation, over-drive detector 224 operates to select the maximum drive level of PA 208, so as to maximize efficiency while maintaining spectral mask performance. That is to say, in other words, that over-drive detector 224 is utilized to allow the power amplifier to boost the amplitude of signals exhibiting complex modulation formats without excessive distortion and without excessive signal power leakage outside of the designated frequency band of transmission.

Over-drive detector 224 also operates to dynamically detect when the drive level into PA 208 exceeds a maximum threshold, thereby increasing the signal power leakage that exists outside of the designated frequency band of transmission beyond that which is acceptable. Over-drive detection is also predictive, thereby allowing the detection of an over-drive condition before the over-drive condition occurs. Finally, over-drive detection in accordance with one or more embodiments of the present invention provides a "soft" metric, which may be used to tailor system performance as required.

Predistorter 202, by appropriate processing of the LUT data provided by conversion block 310, provides an estimate of the amplitude-to-amplitude (AM) characteristic of PA 208. The AM/AM characteristic is computed directly from the contents of the LUTs according to equation (5)

$$AM/AM_{TXMAG} = TX_{MAG} * \frac{1}{|\sum LUTs(TX_{MAG})|}, \quad (5)$$

where the $TX_{MAG}$ values are the y(n) values taken from RX capture block 304 after alignment by alignment block 306.

Figure 4:
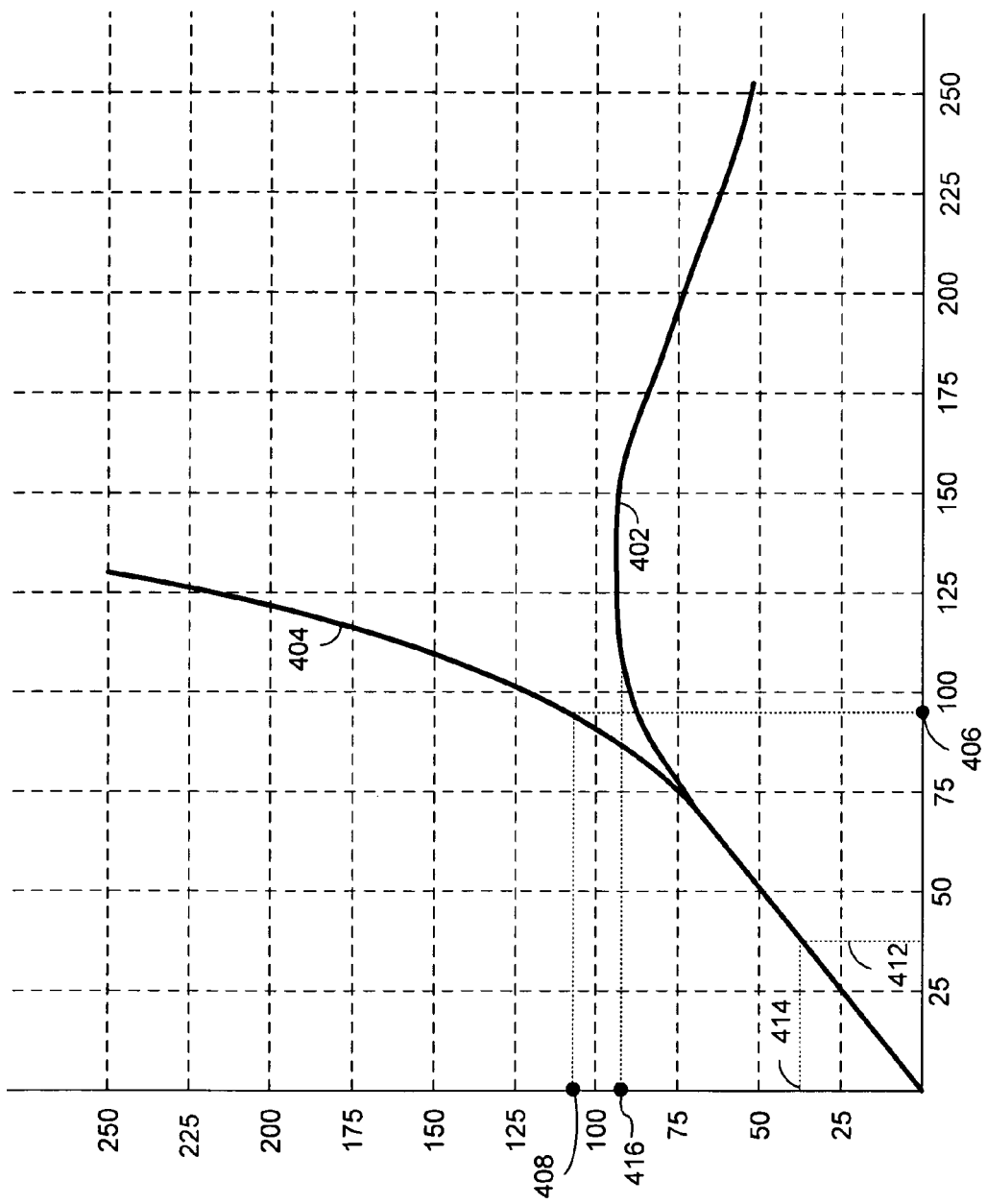
FIG. 4 illustrates amplitude-to-amplitude characteristic curves of the power amplifier of the digital predistortion architecture of FIG. 2 as predicted by the over-drive detection block of FIG. 3 in accordance with one embodiment of the present invention.

The resulting AM/AM characteristic, as may be exhibited by PA 208 to a constant base-band input, may be calculated using equation (5) and plotted as graph 402 in FIG. 4, whereby the non-linearity of PA 208 may be observed by inspection. That is to say, in other words, that as the amplitude of the signal that is applied to the input of PA 208 increases, the predicted output magnitude of PA 208 decreases once the compression point of PA 208 is reached. The inverse of graph 402 may also be predicted by predistorter 202 by taking the sum of each of the complex LUTs at each index, as exemplified by graph 404 of FIG. 4.

Thus, graph 402 represents the non-linear amplitude characteristic of PA 208 as predicted by predistorter 202 from equation (5), whereas graph 404 represents the inverse of the non-linear amplitude characteristic of PA 208 as also predicted by predistorter 202. Thus, by comparing the magnitude of signal z(n) with the amplitude characteristic of graph 402, predistorter may predict the amount of compression that is to be applied by PA 208 with respect to signal z(n). Once the amount of compression is predicted, predistorter 202 may pre-amplify signal z(n) by an amount equal to the predicted compression, so as to equalize the compression imposed by PA 208.

For example, if the amplitude of signal x(n) exhibits a normalized value of, e.g., 37.5 as indicated by dotted line 412, then as can be verified from FIG. 4, the non-linear amplitude characteristic of PA 208, as predicted by graph 402, is substantially equal to its inverse characteristic, as predicted by graph 404. As a result, PA 208 does not impose compression with respect to signal x(n), since the inverse characteristic of graph 404 is also equal to 37.5 as verified by dotted line 414. Accordingly, predistorter 202 does not amplify signal x(n) because PA 208 is not predicted to subject signal x(n) to amplitude compression.

If, on the other hand, the amplitude of signal x(n) exhibits a normalized value of, e.g., 95 (as indicated by dotted line 406), then as can be verified from FIG. 4, PA 208 is predicted to impose compression with respect to signal x(n), since the inverse characteristic indicates a normalized value of, e.g., 110 (as indicated by dotted line 408). In such an instance, predistorter 202 utilizes graphs 402 and 404 to predict that when signal x(n) exhibits a normalized magnitude of 95, then PA 208 imposes a normalized compression magnitude that is equal to 110−95=15. As a result, predistorter 202 pre-amplifies, or expands, the magnitude of signal x(n) by a normalized value of 15, since that is the amount of normalized compression that is predicted by predistorter 202.

It should be noted, that predistorter 202 implements memory terms as discussed above in relation to equation (1). As a result, predistorter 202 itself exhibits a non-linear frequency response, since predistorter 202 exhibits attributes similar to those exhibited by a finite impulse response (FIR) filter. Accordingly, the non-linear frequency response of predistorter 202 should be considered, so as to improve the accuracy of over-drive detector 224.

In order to account for the frequency selectivity of predistorter 202, the LUT terms of equation (5) are pre-rotated in frequency prior to summation as described in equation (6)

$$AM/AM_{TXMAG} = TX_{MAG} * \frac{1}{|\sum LUTs(TX_{MAG}) * e^{-j\varphi m}|}, \quad (6)$$

where $e^{-j\varphi m}$ represents the frequency rotation term. The corresponding frequency shift step size imposed by the frequency rotation term is dependent upon the sampling frequency of predistorter 202 and the integer value of variable, m, in equation (6).

In one embodiment, the number of frequency shifts imposed upon the LUT terms of equation (6) is equal to an integer value of, e.g., +/−10, frequency increments around the center frequency, where each LUT value is pre-rotated in frequency and then summed. The maximum value computed by equation (6) over all frequency rotations is then taken to be the predicted amplitude characteristic of PA 208 for a given amplitude value and plotted within graph 402 as discussed above in relation to FIG. 4.

Figure 5:
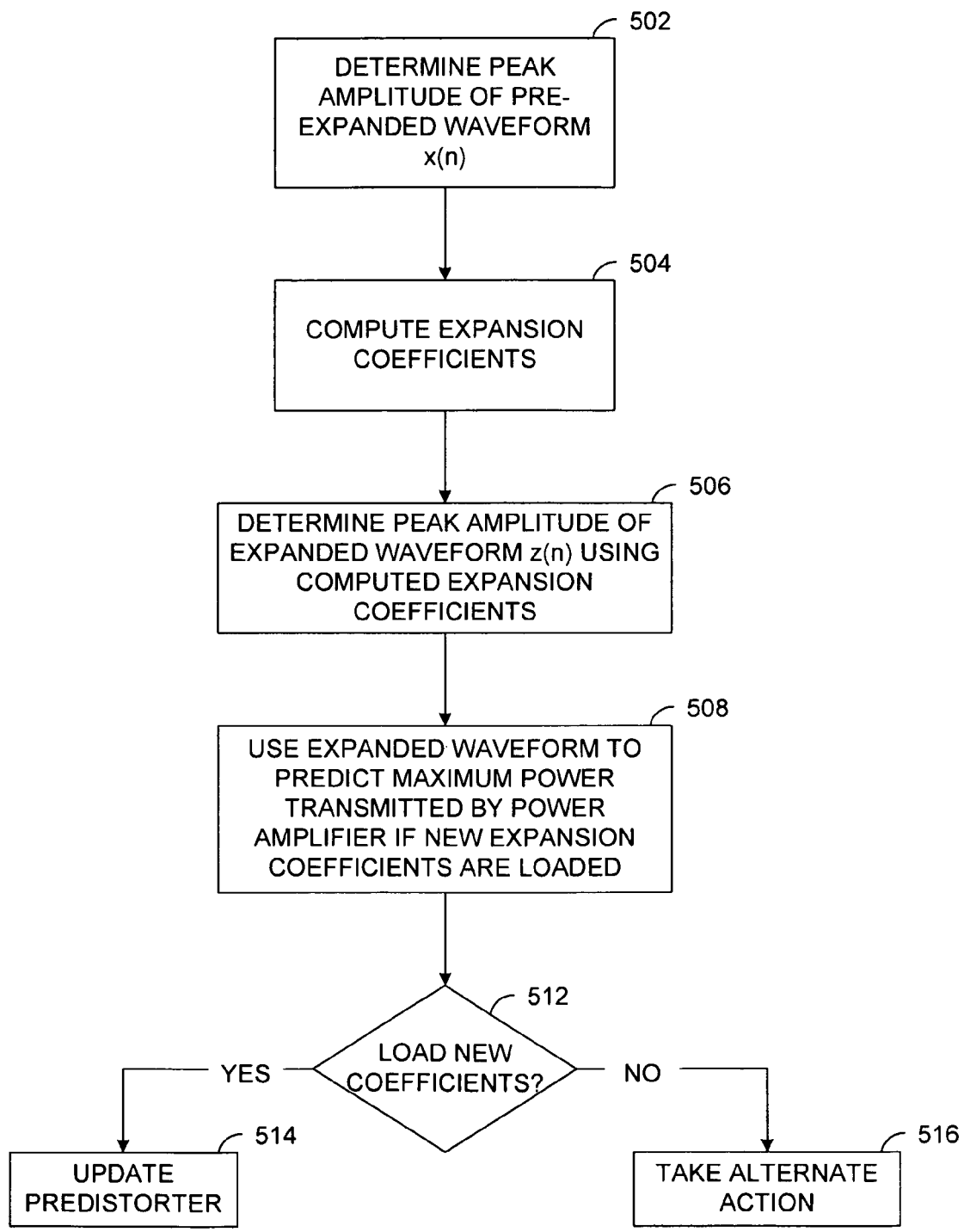
FIG. 5 illustrates a method of implementing over-drive detection in accordance with one embodiment of the present invention.

Turning to FIG. 5, a method of implementing over-drive detection in accordance with one embodiment of the present invention is illustrated. In step 502, the peak amplitude of signal, x(n), is determined, whereby signal x(n) represents the pre-expanded version of signal z(n). For example, the peak amplitude of signal, x(n), may be determined to be equal to a normalized value of, e.g., 95, as indicated by value 406 of FIG. 4. After coefficients, $a_{k_q}$, have been generated by least squares estimator 308, the contents of the LUTs are computed in step 504, but are not loaded into predistorter 202.

Next, the PA inverse is computed in step 506 by summing over all memory terms at the magnitude determined in step 502 with appropriate frequency pre-rotations. That is to say, in other words, that the peak amplitude of expanded signal, z(n), is predicted in step 506, which corresponds to an estimate of the maximum signal magnitude that is provided to the input of PA 208 once the new coefficients are enabled within predistorter 202. Such an estimate is exemplified by the normalized value of, e.g., 110, as indicated by value 408. It is noted, that any PA inverse value may be calculated for any normalized magnitude between 0 and 255 by summing over all memory terms, q, at the magnitude of interest with appropriate frequency pre-rotations as discussed above in relation to equation (6).

Using the extrapolated data value 408 of FIG. 4, the maximum power that is to be transmitted by PA 208 (and correspondingly observed as $RX_{MAXEST}$ by observation block 210) may now be predicted for the new coefficients in step 508 using equation (7)

$$AM/AM_{RXMAXEST} = TX_{MAXEST} * \frac{1}{|\sum LUTs(TX_{MAXEST}) * e^{-j\varphi m}|}, \quad (7)$$

where $TX_{MAXEST}$ is the value extrapolated from value 408 of FIG. 4, e.g., a normalized value of 110, and the value calculated by equation (7) corresponds to value 416 along the AM/AM characteristic of PA 208 as plotted in graph 402. As can be seen, the value calculated by equation (7), e.g., data value 416, corresponds to an operating region of PA 208 that is approaching the saturation region of PA 208, since data value 416 is relatively close to the compression point of PA 208.

The metric used to adaptively predict when an over-drive condition may occur is described in equation (8)

$$OD = \frac{RX_{MAXEST}}{TX_{MAXPRE}}, \quad (8)$$

where $RX_{MAXEST}$ is the value calculated by equation (7) that is represented by, e.g., data value 416 along graph 402, and $TX_{MAXPRE}$ corresponds to the peak amplitude of pre-expanded signal, x(n), as determined in step 502. The metric of equation (8) is then calculated in step 510 so as to determine whether or not the new coefficients should be loaded into predistorter 202.

If the over-drive metric of equation (8) evaluates to a value of 1, for example, then the cascade of predistorter 202 and PA 208 is predicted to be linearized correctly should the new coefficients (i.e., new LUT values) be loaded into predistorter 202. As a result, the new coefficients are approved for use as in step 512 and are loaded into predistorter 202 in step 514.

If, on the other hand, the over-drive metric of equation (8) does not evaluate to a value of 1, but is instead less than 1, then the cascade of predistorter 202 and PA 208 is predicted not to fully linearize PA 208 using the new coefficients. As a result, the new coefficients may not be approved for use as in step 512 and alternate action may be taken in step 516.

For example, the over-drive metric of equation (8) yields a value between 0 and 1 when PA 208 is predicted to not be fully linearized due to an over-drive condition, where the severity of the over-drive condition is indirectly proportional to the over-drive metric value as determined by equation (8). For example, metrics exhibiting smaller values are indicative of a more severe over-drive condition as compared to the over-condition that is indicated by larger valued over-drive metrics. As a result, a minimum threshold may be selected, such that any over-drive metric values, as calculated by equation (8), having magnitudes smaller than a minimally acceptable threshold produces a warning condition, such that the new coefficients are not loaded into predistorter 202. Instead, an alternate solution may be devised in step 516, whereby the drive level of PA 208 is decreased so as to avoid an over-drive condition, thereby avoiding spectral emission violations.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for predictive over-drive protection, comprising:
   determining a peak amplitude of a pre-distorted waveform;
   determining an amount of predistortion, to be added to the pre-distorted waveform by a predistorter, by computing expansion coefficients using a least squares estimator;
   predicting a maximum power amplitude to be received by a power amplifier, wherein the act of predicting the maximum power amplitude comprises computing values in look-up tables based on the expansion coefficients;
   predicting a maximum power amplitude to be transmitted by the power amplifier;
   computing an over-drive metric based on the predicted maximum power amplitude to be transmitted and the peak amplitude of the pre-distorted waveform; and
   adding the determined amount of predistortion to the pre-distorted waveform in response to an acceptable over-drive metric computation.

2. The method of claim 1, wherein the expansion coefficients are to be applied by a digital predistorter.

3. The method of claim 1, wherein predicting the maximum power amplitude to be received by the power amplifier further comprises:
   retrieving the look-up table values by indexing into each look-up table with the determined peak amplitude of the pre-distorted waveform;
   multiplying each retrieved value by a frequency rotation term;
   summing each multiplied value over a number of memory terms contained in the predistorter; and
   taking an inverse of the summed values.

4. The method of claim 3, wherein predicting the maximum power amplitude to be received by the power amplifier further comprises multiplying the inverse by the determined peak amplitude of the pre-distorted waveform.

5. The method of claim 1, wherein predicting the maximum power amplitude to be transmitted by the power amplifier comprises:
   retrieving the look-up table values by indexing into each look-up table with the predicted maximum power amplitude to be received by the power amplifier;
   multiplying each retrieved value by a frequency rotation term;

summing each multiplied value over a number of memory terms contained in the predistorter; and taking an inverse of the summed values.

6. The method of claim 5, wherein predicting the maximum power amplitude to be transmitted by the power amplifier further comprises multiplying the inverse by the predicted maximum power amplitude to be received by the power amplifier.

7. The method of claim 1, wherein computing the over-drive metric comprises taking a ratio of the predicted maximum power amplitude to be transmitted and the determined peak amplitude of the pre-distorted waveform.

8. The method of claim 7, wherein an acceptable over-drive metric computation comprises a computation whose result exceeds a minimum threshold value.

9. The method of claim 7, wherein an unacceptable over-drive metric computation comprises a computation whose result does not exceed a minimum threshold value.

10. A digital predistorter, comprising:
an over-drive detector to receive an undistorted signal and to expand the undistorted signal using expansion coefficients to generate a pre-distorted signal;
an amplifier, coupled to the over-drive detector, to transmit the pre-distorted signal received from the over-drive detector; and
an observation block to sense the transmitted signal and to provide the sensed transmitted signal to the over-drive detector;
wherein the over-drive detector comprises:
a least squares estimator to compute the expansion coefficients using samples of the pre-distorted signal and samples of the sensed transmitted signal; and
a predistorter to programmably expand a magnitude of the undistorted signal by using the undistorted signal and look-up table values generated from the expansion coefficients.

11. The digital predistorter of claim 10, wherein the over-drive detector comprises a first capture buffer to store a first sample set, the first sample set including the samples of the pre-distorted signal.

12. The digital predistorter of claim 11, wherein the over-drive detector further comprises a second capture buffer to store a second sample set, the second sample set including the samples of the sensed transmitted signal.

13. The digital predistorter of claim 12, wherein the over-drive detector further comprises an alignment block to receive the first and second sample sets and to align the first and second sample sets with respect to amplitude, delay, and phase to produce a third sample set.

14. The digital predistorter of claim 13, wherein the least squares estimator is configured to receive the first and the third sample sets and in response, compute the expansion coefficients.

15. The digital predistorter of claim 10, wherein the over-drive detector further comprises a conversion block to receive the expansion coefficients and to provide the look-up table values generated from the expansion coefficients.

16. An over-drive detector, comprising:
a first capture buffer to store a first sample set, the first sample set including samples of a pre-distorted signal;
a second capture buffer to store a second sample set, wherein the second sample set includes samples of a sensed transmitted signal;
an alignment block to receive the first and second sample sets and to align the first and second sample sets with respect to amplitude, delay, and phase to produce a third sample set;
a least squares estimator to receive first and third sample sets and in response, compute expansion coefficients;
a conversion block to receive the expansion coefficients and to provide look-up table values generated from the expansion coefficients; and
a predistorter to receive the undistorted signal and the look-up table values and to programmably expand a magnitude of the undistorted signal in response to a dynamically predicted over-drive condition.

17. The over-drive detector of claim 16, wherein the predistorter models non-linearities of an amplifier that generates the transmitted signal.

18. The over-drive detector of claim 17, wherein the predistorter generates an amplitude-to-amplitude characteristic of the amplifier in response to the look-up table values and the sensed transmitted signal, wherein the amplitude-to-amplitude characteristic is utilized to dynamically predict the over-drive condition.

* * * * *